United States Patent [19]

Sakurai et al.

[11] Patent Number: 5,496,753
[45] Date of Patent: Mar. 5, 1996

[54] METHOD OF FABRICATING A SEMICONDUCTOR NONVOLATILE STORAGE DEVICE

[75] Inventors: Yasuhiro Sakurai; Toshiyuki Kishi, both of Saitama, Japan

[73] Assignee: Citizen Watch, Co., Ltd., Tokyo, Japan

[21] Appl. No.: 182,003

[22] PCT Filed: May 28, 1993

[86] PCT No.: PCT/JP93/00772

§ 371 Date: Jan. 25, 1994

§ 102(e) Date: Jan. 25, 1994

[87] PCT Pub. No.: WO93/24959

PCT Pub. Date: Dec. 9, 1993

[30] Foreign Application Priority Data

May 29, 1992 [JP] Japan .................. 4-161637
Jul. 28, 1992 [JP] Japan .................. 4-219643
Mar. 26, 1993 [JP] Japan .................. 5-090596

[51] Int. Cl.$^6$ .............................................. H01L 21/8247
[52] U.S. Cl. .................. 437/43; 437/978; 437/247; 257/316; 257/324; 257/326
[58] Field of Search ................... 437/43, 49, 52, 437/48, 978; 257/316, 326, 324

[56] References Cited

U.S. PATENT DOCUMENTS

| | | |
|---|---|---|
| 3,590,272 | 6/1971 | Keshavan . |
| 4,264,376 | 4/1981 | Yatsuda et al. . |
| 4,980,307 | 12/1990 | Ito et al. .................. 437/40 |
| 5,120,672 | 6/1992 | Mitchell et al. .................. 437/43 |
| 5,279,981 | 1/1994 | Fukatsu et al. .................. 437/43 |

FOREIGN PATENT DOCUMENTS

| | | |
|---|---|---|
| 48-40668 | 12/1973 | Japan . |
| 51-150284 | 12/1976 | Japan . |
| 55-30846 | 3/1980 | Japan . |
| 57-170572 | 10/1982 | Japan . |
| 60-210878 | 10/1985 | Japan . |
| 64-74761 | 3/1989 | Japan . |
| 284776A | 3/1990 | Japan .................. 437/43 |

OTHER PUBLICATIONS

Chen, "Threshold–Alterable Si–Gate MOS Devices", IEEE Transactions on Electron Devices, vol. ED–24, No. 5, pp. 584–586, May 1977.

Primary Examiner—George Fourson
Assistant Examiner—Richard A. Booth
Attorney, Agent, or Firm—Armstrong, Westerman, Hattori, McLeland, & Naughton

[57] ABSTRACT

In a semiconductor nonvolatile storage element and a method of fabricating the same wherein the semiconductor nonvolatile storage element having a MONOS structure including a tunnel oxide film (3), a memory nitride film (5), a top oxide film (7) and a memory gate electrode film (9) which are sequentially layered on a semiconductor substrate (1) in this order within storage element regions, the pattern size of the memory gate electrode film (9) within the storage element region is smaller than that of the memory nitride film (7) within the same region. In such an arrangement, the operation of the semiconductor nonvolatile storage element is assured to thereby improve the reliability and data is rewriteable so many times.

4 Claims, 15 Drawing Sheets

METHOD OF FABRICATING A SEMICONDUCTOR NONVOLATILE STORAGE DEVICE

TECHNICAL FIELD

The present invention relates to a semiconductor nonvolatile storage element (nonvolatile memory), a semiconductor device on which the nonvolatile memory is mounted and a method of fabricating them, particularly to a nonvolatile memory having a MONOS or MNOS structure, a semiconductor device on which the nonvolatile memory is mounted and a method of fabricating them, and a structure of the nonvolatile memory having storage element regions and field regions and a method of fabricating the same.

BACKGROUND TECHNOLOGY

A semiconductor nonvolatile storage element in which data is electrically rewriteable and which is called as an EEPROM has many types and comprises typically a MONOS memory, a MNOS memory and a floating gate memory.

The MONOS memory is a semiconductor nonvolatile storage element having the structure of Metal-Oxide-Nitride-Oxide-Semiconductor in a cross section while the MNOS memory is a semiconductor nonvolatile storage element having the structure of Metal-Nitride-Oxide-Semiconductor in a cross section.

The MONOS memory is the nonvolatile storage element which realizes a high reliability and a thin film by subjecting the memory nitride film of a prior art MONOS memory to the thermal oxidation for thereby forming the oxide film on the memory nitride film. The oxide film layered on the memory nitride film is normally called a "top oxide film" while the oxide film layered under the memory nitride film is called a "tunnel oxide film".

The MONOS memory has lately attracted considerable attention because it has a high reliability and data is rewriteable therein many times.

The MONOS memory comprises, for example, as shown in FIG. 2, a semiconductor substrate 1, a tunnel oxide film 3, a memory nitride film 5, a top oxide film 7 and a memory gate electrode film 9. In the prior art MONOS memory, the top oxide film 7, memory nitride film 5, the tunnel oxide film 3 and the memory gate electrode film 9 are formed of respectively the same patterns having the same sizes at least within the storage element region.

FIG. 2 is a cross-sectional view showing the arrangement of a semiconductor device on which the prior art MONOS memory is mounted wherein only the gate of the MONOS memory within the storage element region and the portion adjoining thereto and the gate of the MOS transistor constituting a peripheral circuit are shown and the portion adjoining thereto but the illustration of the interconnections with metallizations is omitted.

With reference to FIG. 2 describing the structure of the MONOS memory in detail, there are formed the tunnel oxide film 3, the memory nitride film 5, the top oxide film 7 and the memory gate electrode film 9 which are sequentially layered in this order and have the same pattern sizes within the storage element region on the surface of the semiconductor substrate 1.

A gate oxide film 11 of the MOS transistor constituting the peripheral circuit is formed on the surface of the semiconductor substrate 1 outside the storage element region and a gate electrode film 13 of the MOS transistor is formed on the gate oxide film 11.

The memory gate electrode film 9 and the gate electrode film 13 of the MOS transistor can be formed in the same step or in different steps. The memory gate electrode film 9 and the gate electrode film 13 of the MOS transistor are generally formed in the same step so as to not impede the MOS transistor characteristics of the peripheral circuit.

That is, such a semiconductor nonvolatile storage element is normally fabricated as a semiconductor device which is integrated with the peripheral circuit to form a chip.

In case of fabricating the nonvolatile storage element as the semiconductor device, there is a case to lay stress on the nonvolatile memory characteristics such as a rewriteable speed or a data holding characteristics or a case to lay stress on the peripheral circuit characteristics.

The nonvolatile memory characteristics is laid on stress in case that a general purpose memory and the peripheral circuit comprise mostly a digital circuit while the peripheral circuit characteristics is laid on stress in case the peripheral circuit is provided with an analog circuit.

In case of the digital circuit, even if the transistor characteristics constituting the digital circuit is deteriorated to some extent, it does not impede the operation of the digital circuit. However, in case of the analog circuit, the deterioration of the transistor characteristics which is caused by mounting the nonvolatile memory at the same time is not permitted since the analog circuit utilizes the transistor characteristics per se in many cases.

Accordingly, the fabrication of the semiconductor device is difficult in case of laying stress on the peripheral circuit characteristics.

To solve the difficulties as set forth above, many devices have been conventionally performed in the fabricating method, for example, there is a method relative to the MONOS memory as disclosed in Japanese Laid-Open Patent Publication No. 60-60770.

An example of the prior art method of fabricating a typical semiconductor device on which the MONOS memory is mounted is described with reference to FIGS. 34 to 43.

FIGS. 34 to 43 are typical cross-sectional views showing the steps ranging from the step following the formation of the element isolation region to the step to form the gate electrode wherein the illustration of steps before and after these steps is omitted.

First, as shown in FIG. 34, the surface of a silicon substrate 1 as the semiconductor substrate is subjected to the thermal oxidation to thereby form a sacrificial oxide film 2.

Secondly, as shown in FIG. 35, the sacrificial oxide film 2 is selectively removed using a resist 4 to thereby expose a part of the surface of the silicon substrate 1 within a storage element forming region 31.

After the removal of the resist 4, the exposed silicon substrate 1 is subjected to the thermal oxidation to thereby form a tunnel oxide film 3.

Then as shown in FIG. 37, a memory nitride film 5 is formed on the tunnel oxide film 3 and the oxide film of the sacrificial oxide film 2.

Further, as shown in FIG. 38, the memory nitride film 5 is subjected to the thermal oxidation to thereby form a top oxide film 7.

Next, as shown in FIG. 39, the top oxide film 7 and the memory nitride film 5 and the tunnel oxide film 3 are selectively removed using the resist 4.

Successively, as shown in FIG. 40, the sacrificial oxide film 2 is removed and thereafter as shown in FIG. 41, the resist 4 is removed and the silicon substrate 1 is subjected to the thermal oxidation to thereby form a gate oxide film (insulator film) 11 for the peripheral circuit.

Next, as shown in FIG. 42, a gate electrode film member 15 comprising a polycrystalline silicon is formed on these films.

Then, as shown in FIG. 43, the gate electrode film member 15 is selectively removed using the resist 4 to thereby form the memory gate electrode film 9 and the gate electrode film 13 of the MOS transistor.

If the resist 4 is removed thereafter, the semiconductor device is formed in the same structure as that as shown in FIG. 2. It is enough to take the same subsequent steps as those in the method of fabricating the semiconductor device on which the nonvolatile memory is not mounted.

Such a prior art semiconductor nonvolatile storage element mounted on the semiconductor device (MONOS memory in this example) is not fabricated in its self-alignment as evident from FIGS. 2 and 43 although the memory gate electrode film 9 and the film constituting the lower layer within the element forming region, namely, the top oxide film 7, the memory nitride film 5 and the tunnel oxide film 3 have respectively the same pattern sizes.

Accordingly, there is a possibility that the memory gate electrode film 9 is formed slightly dislocated from the film constituting the lower layer. That is, if the memory gate electrode film 9 is formed at the position which is slightly dislocated, a part of the memory gate electrode film 9 is formed on the gate oxide film 11.

In such a case, the same structure as the MOS transistor constituting the peripheral circuit is formed in either side of the source or the drain of the MONOS memory. Accordingly, there was a problem that the read operation of the MONOS memory was uncertain since the memory gate electrode film 9 which was slightly dislocated and the region of the gate oxide film 11 of the MOS transistor formed an offset gate.

It is a first object of the invention to solve this problem and to provide a semiconductor nonvolatile storage element of the MONOS structure and a method of fabricating the same which can perform the read operation with assurance.

The prior art method of fabricating the semiconductor device as explained with reference to FIGS. 34 to 43 is the one which laid stress on the transistor characteristics of the peripheral circuit and is very excellent since it can obtain the quite same peripheral circuit characteristics or performance in case that the nonvolatile memory is not mounted.

However, the consideration to the nonvolatile memory is not sufficient. As a result, there is a disadvantage that an erasing operation takes long time.

It is known that the method of subjecting the tunnel oxide film to the thermal nitriding is effective to speed up the erasing operation without deteriorating the data holding characteristics and this method for the MONOS is described for example in Japanese Laid-Open Patent Publication No. 60-55669.

However, the thermal nitriding process exerts a serious influence upon the transistor characteristics of the peripheral circuit. Accordingly, if the peripheral circuit includes an analog circuit, the nonvolatile memory characteristics is not improved by subjecting the tunnel oxide film to the thermal nitriding.

It is a second object of the invention to provide a method of fabricating the semiconductor device which can solve the aforementioned problems, can subject the tunnel oxide film to the thermal nitriding without exerting an influence upon the transistor characteristic of the peripheral circuit, can improve the nonvolatile memory characteristics and can speed up the erasing operation.

Another example of the arrangement of the prior art semiconductor nonvolatile storage element will be described with reference to the cross-sectional view of FIG. 45. FIG. 45 is typical cross-sectional view of the memory transistor taken along a channel width direction.

The memory transistor constituting the semiconductor nonvolatile storage element comprises storage element regions 22 composed of a tunnel oxide film 24, a silicon nitride film 25, a top oxide film 26 and a memory gate electrode 27 which are sequentially formed on a semiconductor substrate 23 and field regions 21 composed of field oxide films 28, the tunnel oxide film 24, the silicon nitride film 25, the top oxide film 26 and the memory gate electrode 27.

A method of fabricating this semiconductor nonvolatile storage element will be described with reference to FIGS. 44 and 45 showing typical cross-sectional views.

As shown in FIG. 44, the field oxide films 28 each having thick thickness are formed on the first conductive type semiconductor substrate 23 within field regions 21 around storage element regions 22 using a selective oxidation method.

Thereafter, a sacrificial oxide film 29 is formed on the entire surface and a shielding silicon nitride film 30 is formed on the sacrificial oxide film 29 and thereafter a region for forming the memory gate electrode 27 is formed using a photo-etching technique, namely, by removing the shielding silicon nitride film 30 and the sacrificial oxide film 29 within all the regions in FIG. 44.

With such an arrangement, there remain the sacrificial oxide film 29 and the shielding silicon nitride film 30 on the region where the memory gate electrode 27 is not formed.

Thereafter, as shown in FIG. 45, a silicon dioxide film is formed on the entire surfaces for forming the tunnel oxide film 24 and the tunnel oxide film 24 is subjected to the thermal nitriding in the atmosphere including ammonia gas to thereby form the nitride oxide film.

The silicon nitride film 25 and the top oxide film 26 are formed on the tunnel oxide film 24 formed of the nitride oxide film and a polycrystalline silicon film forming the memory gate electrode 27 is further formed on the top oxide film 26.

The polycrystalline silicon film, the top oxide film 26, the silicon nitride film 25 and the tunnel oxide film 24 are respectively etched using the photo-etching technique to thereby form the memory gate electrode 27.

Thereafter, a second conductive source region and a drain region are formed on the semiconductor substrate 23 on the region where the memory gate electrode 27 is aligned, not shown, whereby the semiconductor nonvolatile storage element is formed.

In the memory transistor of the semiconductor nonvolatile storage element which is fabricated by the aforementioned method, each of the field regions 21 is composed of the field oxide films 28 alone in the step to form the tunnel oxide film 24 and subject the tunnel oxide film 24 to the thermal nitriding in the atmosphere including the ammonia gas.

Accordingly, there is the following reaction between the tunnel oxide film 24 and the field oxide film 28.

$$3SiO_2 + 4NH_3 \rightarrow Si_3N_4 + 6H_2O$$

Whereupon, the oxide film is dissociated by the action of hydrogen which is generated by the decomposition of ammonia to thereby generate non-bonded silicon ions so that the positive charges on the insulator film increase in the field oxide film 28.

Therefore, if the memory element is formed of an N-channel, the threshold voltage of the parasitic MOS transistor formed by the field oxide films 28 for isolating the memory elements is lowered by the positive charges on the insulator film so that a leakage current generates between the memory elements which causes the inferior data.

To solve the problem as set forth immediately before, it is a third object of the invention to provide a semiconductor nonvolatile storage element and a method of fabricating the same which can reduce the leakage current between the storage elements by the lowering of the threshold voltage of the parasitic MOS transistor within the field region so that the read operation can be performed with safety in the memory characteristics.

DISCLOSURE OF THE INVENTION

To achieve the first object of the invention, in a first aspect of the invention, in a semiconductor nonvolatile storage element of MONOS structure including a tunnel oxide film, a memory nitride film, a top oxide film and a memory gate electrode film which are sequentially layered in this order within a storage memory region on a semiconductor substrate, the memory gate electrode film within the storage element region is smaller in a pattern size than the memory nitride film within the same region.

In order to fabricate the semiconductor nonvolatile storage element, the present invention provides a method of fabricating the semiconductor nonvolatile storage element comprising at least the following steps.

(1) subjecting the surface of the semiconductor substrate to the thermal oxidation to thereby form a tunnel oxide film, (2) forming a memory nitride film on the tunnel oxide film, (3) subjecting the memory nitride film to the thermal oxidation to thereby form a top oxide film;

(4) selectively removing the top oxide film, the memory nitride film and the tunnel oxide film which are formed on the semiconductor substrate outside the storage element region to thereby expose the surface of the semiconductor substrate, (5) subjecting the surface of the semiconductor substrate to the thermal oxidation to thereby form a gate oxide, (6) forming a gate electrode film member on the semiconductor substrate on which the gate oxide film is formed, and (7) selectively removing the gate electrode film member in the manner that the gate electrode film member is smaller in the pattern size than the memory nitride film within the storage element region.

In such a manner, since the size of the memory gate electrode film in the semiconductor nonvolatile storage element having the MONOS structure is smaller than at least the size of the memory nitride film layered thereunder, a part of the memory gate electrode film is prevented from being extended from the film layered thereunder and formed on the gate oxide film even if the memory gate electrode film is formed on the position which is slightly dislocated from the target position due to the displacement of the alignment apparatus.

With such an arrangement, the read operation of the semiconductor nonvolatile storage element can be performed with assurance to thereby improve the reliability and obtain the semiconductor nonvolatile memory in which data is rewriteable so many times.

To achieve the second object of the invention, a second aspect of the invention is to provide a method of fabricating a semiconductor device comprising at least the following steps in case of fabricating the semiconductor device on which a semiconductor nonvolatile storage element is mounted together with a peripheral circuit (1) forming a sacrificial oxide film on a silicon substrate, (2) forming a shielding silicon nitride film on the silicon substrate on which the sacrificial oxide film is formed, (3) selectively removing the shielding silicon nitride film and the sacrificial oxide film to thereby expose the surface of the silicon substrate within a storage element forming region, (4) forming a tunnel oxide film on the exposed surface of the silicon substrate, (5) subjecting the tunnel oxide film to the thermal nitriding in the atmosphere including ammonia gas, (6) forming a charge trapping film on the tunnel oxide film which was subjected to the thermal nitriding for trapping charge of the silicon nitride film or polycrystalline silicon film, etc., and (7) removing the shielding silicon nitride film at any of the steps after the formation of the charge trapping film.

The method of fabricating the semiconductor device may comprise the following steps instead of the steps (6) and (7) as set forth above.

(6) forming a memory nitride film on the silicon substrate which was subjected to the thermal nitriding, (7) subjecting the memory nitride film to the thermal oxidation to thereby form a top oxide film, (8) selectively removing the top oxide film and the memory nitride film so that they remain at least on the tunnel oxide film, (9) following the previous step, removing the shielding silicon nitride film and the sacrificial oxide film to thereby expose the surface of the silicon substrate,

(10) subjecting the exposed surface of the silicon substrate to the thermal oxidation to thereby form a gate insulator film,

(11) forming a gate electrode film member on the silicon substrate on which the gate insulator film is formed, and

(12) selectively removing the gate electrode film member to thereby form a nonvolatile storage element gate portion and a peripheral circuit gate portion.

Furthermore, a step of selectively removing the oxide film on the surface of the memory nitride film may be provided between the steps of (10) and (11), The method of fabricating the semiconductor device may comprise the following steps instead of the steps (6) and (7) of the first method of the second aspect of the invention.

(a) forming a charge trapping polycrystalline silicon film on the silicon substrate which was subjected to the thermal nitriding, (b) implanting impurities into the charge trapping polycrystalline silicon film, (c) selectively removing the charge trapping polycrystalline silicon film so that it remains at least on the tunnel oxide film, (d) following the step of selectively removing the charge trapping polycrystalline silicon film, removing the shielding silicon nitride film and the sacrificial oxide film to thereby expose the surface of the silicon substrate, (e) subjecting the exposed surface of the silicon substrate to the thermal oxidation to thereby form a gate insulator film, (f) forming a gate electrode film member on the silicon substrate on which the gate insulator film is formed and (g) selectively removing the gate electrode film member to thereby form a nonvolatile storage element gate portion and a peripheral circuit gate portion.

In case of subjecting the tunnel oxide film to the thermal nitriding in the atmosphere including ammonia gas, the surface of the oxide film is subjected to nitriding and at the same time the bond of nitrogen and hydrogen which is decomposed from ammonia passes the oxide film and reaches the surface of the silicon substrate where the nitriding material is formed or speed up diffusion occurs, which influences the peripheral circuit characteristics.

In the method of fabricating each of the aforementioned semiconductor devices, the peripheral circuit portion is covered by the shielding nitride film before the thermal nitriding step wherein the shielding silicon nitride film prevents the entrance of the bond of nitrogen and hydrogen.

Furthermore, since the shielding silicon nitride film is removed after the formation of the charge trapping film, the peripheral circuit characteristics is prevented from varying due to the thermal nitriding treatment.

Accordingly, the tunnel oxide film can be subjected to the thermal nitriding without influencing the transistor characteristics of the peripheral circuit irrespective of the kinds of the semiconductor nonvolatile memory. In such a manner, it is possible to mount the semiconductor nonvolatile memory having the high erasing speed on the semiconductor device even if the latter includes an analog circuit.

To achieve the third object of the invention, a third aspect of the invention is to provide a semiconductor nonvolatile storage element comprising storage element regions including a tunnel oxide film, a silicon nitride film, a top oxide film and a memory gate electrode which are sequentially layered on a semiconductor substrate in this order and field regions including a field oxide film and a memory gate electrode which are formed on the semiconductor substrate.

Furthermore, in order to fabricate the semiconductor nonvolatile storage element, it also provides a method of fabricating the semiconductor nonvolatile storage element comprising the following steps.

(1) forming a field oxide film within field regions around storage element regions of a first conductive type semiconductor substrate, thereafter forming a sacrificial oxide film which is layered within the storage element region and a shielding silicon nitride film which is layered within the field oxide film, (2) removing the sacrificial oxide film and the shielding silicon nitride film within the storage element region using a photo-etching technique, (3) forming a tunnel oxide film, (4) subjecting the tunnel oxide film to the thermal nitriding in the atmosphere including ammonia gas, (5) forming a silicon nitride film and a top oxide film, (6) removing the top oxide film, the silicon nitride film, the tunnel oxide film and the shielding silicon nitride film within the field region using the photo-etching technique to thereby expose the field oxide film, (7) forming a memory gate electrode member such as polycrystalline silicon on the entire surface of the field oxide film, and (8) selectively removing the memory gate electrode member using the photo-etching technique to thereby form a memory gate electrode.

According to the semiconductor nonvolatile storage element and the method of fabricating the same, in the steps of forming the tunnel oxide film and subjecting the tunnel oxide film to the thermal nitriding in the atmosphere including ammonia gas, the silicon nitride film is present on the field oxide film within the field region.

The silicon nitride film prevents ammonia as a reaction gas and hydrogen which is produced by decomposition of ammonia from diffusing into the field oxide film. Accordingly, the oxide film is restrained from dissociated by hydrogen so that positive charges on the insulator film do not increase.

As a result, the threshold voltage of the parasitic MOS transistor formed by the field oxide film is not lowered and no leakage current generates between memory cells, thereby obtaining a high reliable semiconductor nonvolatile storage device.

BEST MODE FOR CARRYING OUT THE INVENTION

The present invention will be described with reference to the attached drawings so as to explain it more in detail.

[Embodiment of the First Aspect of the Invention]

The embodiment of the first aspect of the invention will be described first with reference to FIGS. 1 and 3 to 10.

Figure 1:
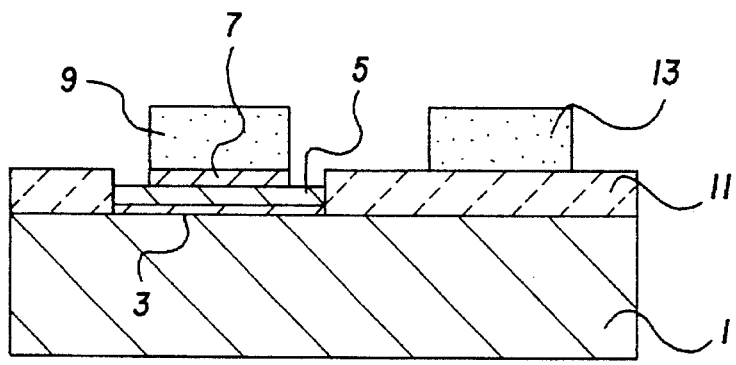
FIG. 1 is a typical cross-sectional view of a semiconductor device on which a MONOS memory according to a first aspect of the invention is mounted.
Figure 2:
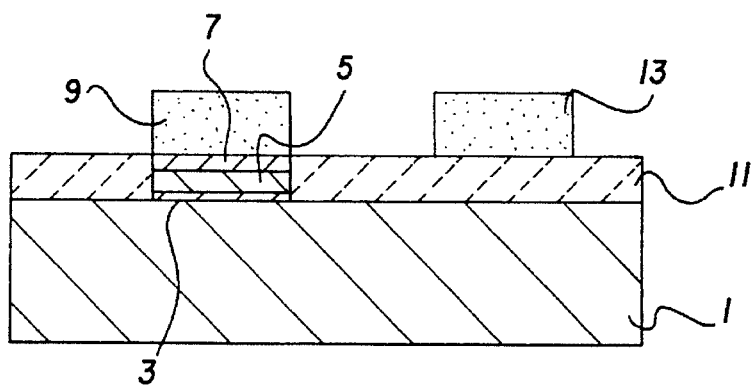
FIG. 2 is a typical cross-sectional view of a semiconductor device on which a prior art MONOS memory is mounted.

FIG. 1 is a typical cross-sectional view showing the structure of a semiconductor device on which a nonvolatile storage element, i.e. MONOS memory according to the embodiment of the present invention is mounted. In FIG. 1, there are shown only the gate of the MONOS memory and the portion adjoining thereto within a storage element region and the gate of the MOS transistor constituting a peripheral circuit and the portion adjoining thereto but the illustration of interconnections with metallizations is omitted.

The MONOS memory comprises a tunnel oxide film 3 and a memory nitride film 5 which are the same in the pattern size and sequentially layered on a semiconductor substrate 1 within the storage element region.

On the tunnel oxide film 3 and the memory nitride film 5, there are sequentially layered a top oxide film 7 and a memory gate electrode film 9 which are smaller in the pattern size than the tunnel oxide film 3 and the memory nitride film 5.

There is provided a gate oxide film 11 of a MOS transistor constituting a peripheral circuit on the surface of the semiconductor substrate 1 except the region on which the tunnel oxide film 3 and the memory nitride film 5 are formed. There is provided a gate electrode film 13 of the MOS transistor on the gate oxide film 11.

In this case, the ratio of pattern sizes of the top oxide film 7 and the memory gate electrode film 9 relative to those of the tunnel oxide film 3 and the memory nitride film 5 depends on the alignment accuracy of an alignment apparatus which is used when a resist pattern is formed on the memory gate electrode film 9.

An existing alignment apparatus needs to have an alignment tolerance of about 0.1 μm.

Accordingly, the pattern sizes of the top oxide film 7 and the memory gate electrode film 9 need to be smaller than those of the tunnel oxide film 3 and the memory nitride film 5 formed thereunder by at least about 0.2 μm.

An example of the method of fabricating the semiconductor device on which the MONOS memory is mounted will be described more in detail with reference to FIGS. 3 to 10.

Each of these figures shows only the gate of the MONOS memory within the storage element region and the portion adjoining thereto and the gate of the MOS transistor constituting the peripheral circuit and the portion adjoining thereto wherein the illustration of the interconnections with the metallizations is omitted. They further show steps ranging from the step after the formation of an element isolation region to the step to form a gate electrode.

Figure 3:
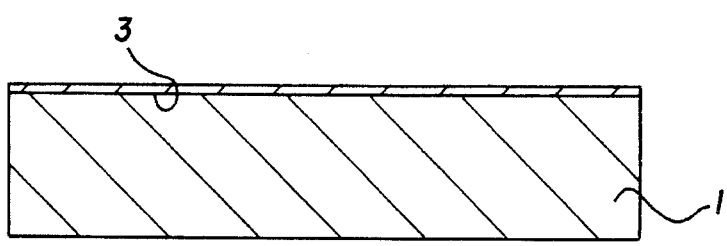
FIGS. 3 to 10 are typical cross-sectional views showing each step of the method of fabricating the semiconductor device in sequence of steps on which the MONOS memory of FIG. 1 is mounted.

Firstly, as shown in FIG. 3, the semiconductor substrate 1 is subjected to the thermal oxidation so that the tunnel oxide film 3 having the thickness of about 2 nm is formed on the surface of the semiconductor substrate 1.

Figure 4:
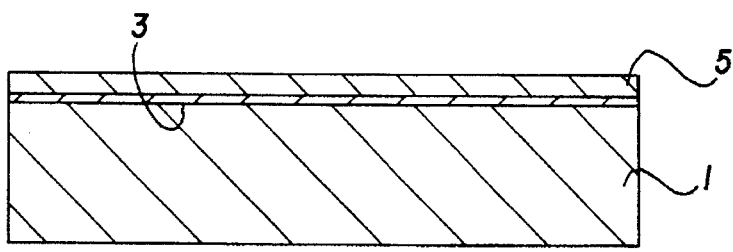

Secondly, as shown in FIG. 4, the memory nitride film 5 composed of a silicon nitride film having the thickness of about 10 nm is formed on the tunnel oxide film 3 using a chemical vapor deposition system.

Figure 5:
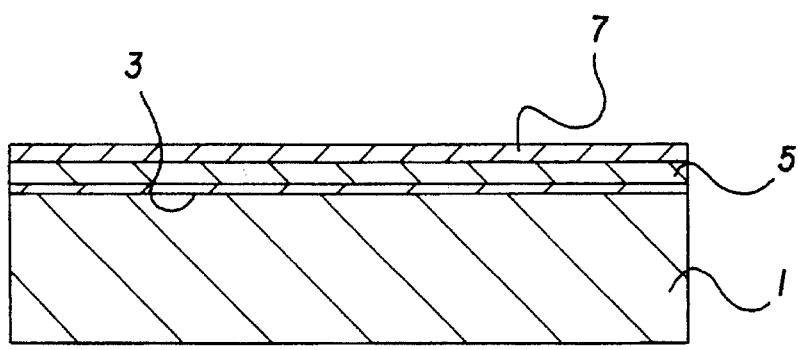

Then, as shown in FIG. 5, the memory nitride film 5 is subjected to the thermal oxidation to thereby form a top oxide film 7 having the thickness of 5 nm on the memory nitride film 5.

Figure 6:
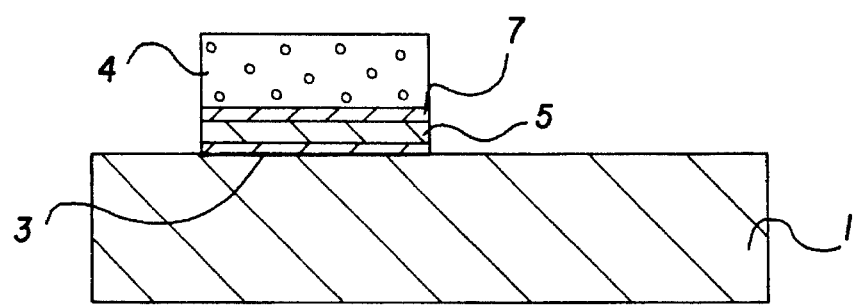

Next, a photoresist (resins) is applied on the entire surface of the top oxide film 7 and it is subjected to exposure and development treatment as shown in FIG. 6 then the top oxide film is selectively etched and removed and successively the memory nitride film 5 and the tunnel oxide film 3 are selectively etched and removed.

Figure 7:
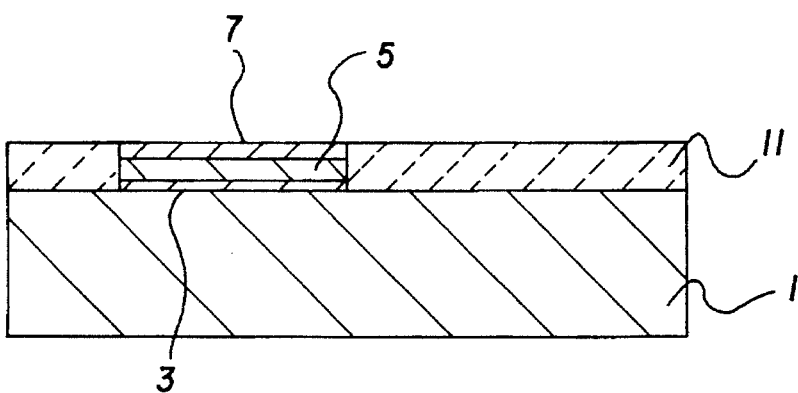

Thereafter, the resist 4 is removed and the semiconductor substrate 1 is subjected to the thermal oxidation to thereby form a gate oxide film 11 having the thickness of about 25 nm of the MOS transistor for the peripheral circuit as shown in FIG. 7.

Figure 8:
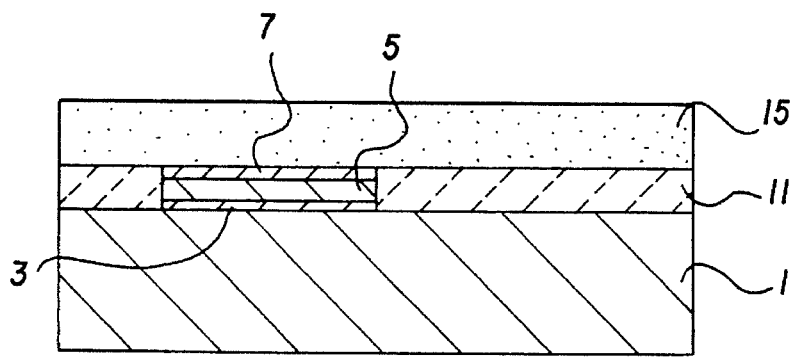

Then, as shown in FIG. 8, a gate electrode film member 15 composed of polycrystalline silicon is formed in the thickness of about 400 nm on the entire surface of these films using the chemical vapor deposition system.

Figure 9:
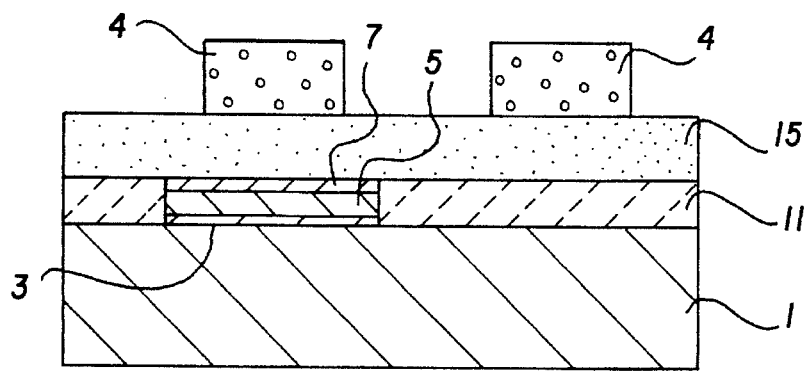

Successively, as shown in FIG. 9, the pattern of the resist 4 is formed on the gate electrode film member 15 by the exposure and development treatment.

At this time, the pattern size of the resist 4 needs to be smaller than those of the top oxide film 7, the memory nitride film 5 and the tunnel oxide film 3.

There is formed the resist 4 having a given pattern size as the peripheral circuit over the gate oxide film 11 of the MOS transistor for the peripheral circuit.

Figure 10:
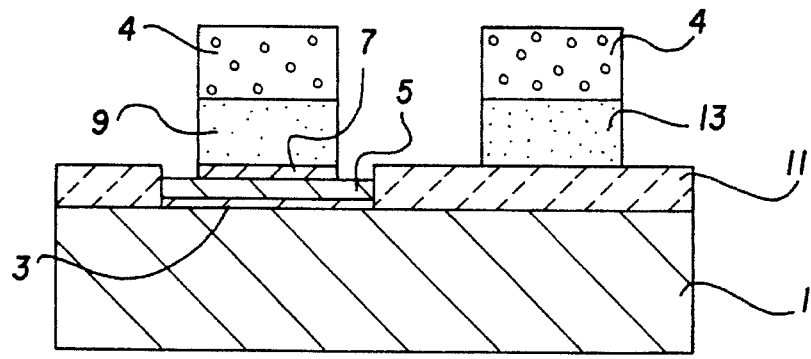

Next, as shown in FIG. 10, the gate electrode film member 15 is etched using the resist 4 as an etching mask to thereby form the memory gate electrode film 9 and the gate electrode film 13 of the MOS transistor constituting the peripheral circuit.

At this time, the portion of the top oxide film 7 which extends from the memory gate electrode film 9 is etched together with the memory gate electrode film 9. This is caused by the performance of the existing etching apparatus such as etching uniformity and etching selectivity.

Subsequent steps may be taken in the same way as those in the method of fabricating the semiconductor device on which the MONOS memory is not mounted.

The MONOS memory of the invention can be fabricated by the method as set forth above.

In case of selectively removing the gate electrode film member 15 so as to form a desired shape, the resist 4 is first subjected to the exposure and development treatment and successively a mask pattern is transferred to the resist 4. Thereafter, the gate electrode film member 15 is etched using the resist 4 as the etching mask.

The alignment apparatus such as a stepper is employed for transferring the mask pattern to the resist. There exists an alignment tolerance in such an alignment apparatus. Accordingly, it is impossible to form the pattern having the quite same size as the substrate film at the same position.

If the substrate film is previously made large counting on the alignment tolerance of the alignment apparatus, the upper pattern is prevented from being dislocated on the substrate film.

In the first embodiment, the substrate film for processing the gate electrode film member 15 is in the first place the top oxide film 7. Accordingly, the pattern size of the resist 4 is made smaller than that of the top oxide film 7 and the gate electrode film member 15 is selectively etched and removed.

However, since the top oxide film 7 has the thickness of about 5 nm, the top oxide film 7 is liable to be etched at the same size as the memory gate electrode film 9 due to overetching at the time of etching the gate electrode film member 15.

Under the circumstances, final pattern sizes of the tunnel oxide film 3 and the memory nitride film 5 are the same with each other and the pattern sizes of the top oxide film 7 and the memory gate electrode film 9 are slightly smaller than those of the tunnel oxide film 3 and the memory nitride film 5.

In the MONOS memory structure of the first aspect of the invention, it is indispensable to the MONOS memory that the pattern size of the memory gate electrode film 9 is smaller than at least that of the memory nitride film 5.

In the first embodiment, although the sizes of the top oxide film 7 and the memory gate electrode film 9 are resultantly made the same as shown in FIG. 1 because of the performance of the existing etching apparatus, the MONOS memory is quite all right to be fabricated without etching the top oxide film 7 at the time of formation of the memory gate electrode film 9 while the memory gate electrode film 9 is the same in size as the memory nitride film 5 and the tunnel oxide film 3 because of the prospective improvement of the performance of the etching device.

Since the size of the memory gate electrode film 9 of the MONOS memory is made smaller than at least that of the lower layered memory nitride film 5, even if the formation position of the memory gate electrode film 9 is slightly displaced from the target position due to the alignment tolerance of the alignment apparatus, the memory gate electrode film 9 is not formed on the gate oxide film 11 at any part thereof when it is dislocated from its lower layered film.

With such an arrangement, it is possible to provide the MONOS memory which assures the read operation. It is also possible to obtain the semiconductor nonvolatile storage element which assures high reliability and in which data is rewriteable so many times.

[Second Aspect of the Invention]

A second aspect of the invention will be described with reference to FIGS. 11 to 33.

The first embodiment of the second aspect of the invention is described with reference to FIGS. 11 to 21 which are typical cross-sectional views showing each step of the method of fabricating the semiconductor device in sequence of steps (which has the same structure as the semiconductor as shown in FIG. 1) on which a MONOS memory is mounted, wherein elements corresponding to those as shown in FIGS. 1 to 10 are denoted at the same numerals.

FIGS. 11 to 21 also show the steps ranging from the step after the formation of the element isolation region to the step to form the gate electrode and the illustration of the steps before and after these steps is omitted.

Figure 11:
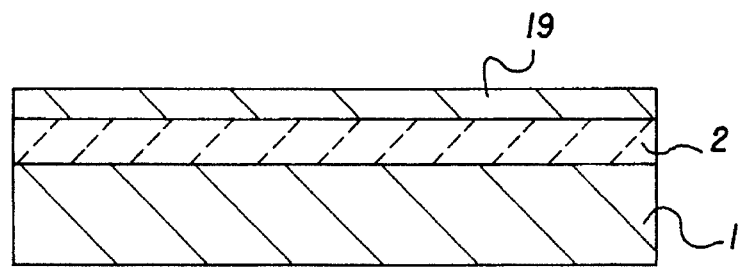
FIGS. 11 to 21 are typical cross-sectional views showing each step in a method of fabricating the semiconductor device in sequence on which a MONOS memory according to the first embodiment of a second aspect of the invention is mounted.

In the method of fabricating the semiconductor device according to the first embodiment, firstly, as shown in FIG. 11, the surface of the semiconductor substrate (hereinafter referred to as a silicon substrate) 1 is subjected to the thermal oxidation to thereby form a sacrificial oxide film 2 on the silicon substrate 1 and a shielding nitride film 19 is formed on the sacrificial oxide film 2 using a chemical vapor deposition process.

Figure 12:
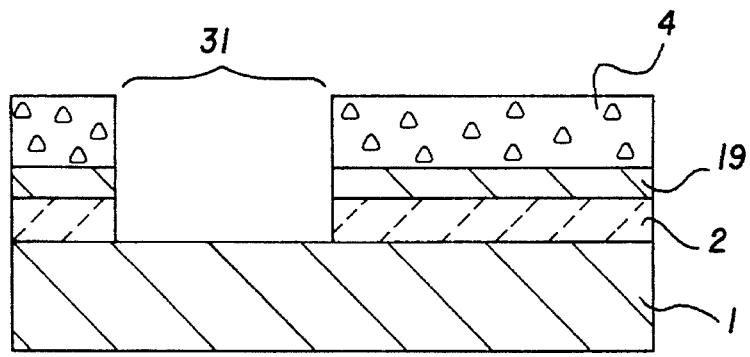

Secondly, as shown in FIG. 12, the shielding silicon nitride film 19 and the sacrificial oxide film 2 are selectively removed using the resist 4, thereby exposing a part of the surface of the silicon substrate 1 within a storage element forming region 31.

Figure 13:
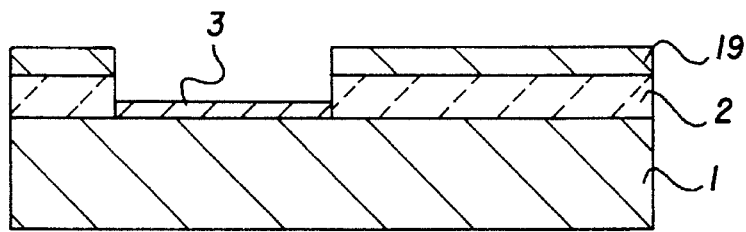

Then, after removing the resist 4, as shown in FIG. 13, the exposed silicon substrate 1 is subjected to the thermal oxidation so as to form the tunnel oxide film 3 on the silicon substrate 1.

Figure 14:
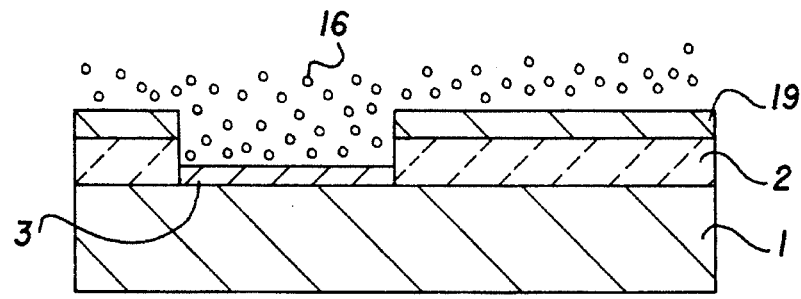

Next, as shown in FIG. 14, the tunnel oxide film 3 is subjected to the thermal nitriding in the atmosphere including ammonia gas 16.

Figure 15:
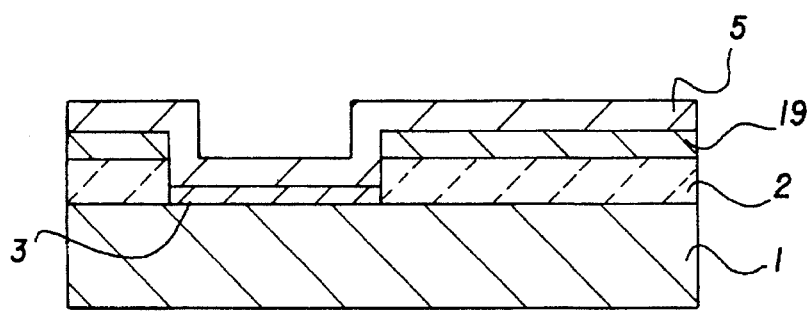

Further, as shown in FIG. 15, the memory nitride film 5 is formed using the chemical vapor deposition process.

Figure 16:
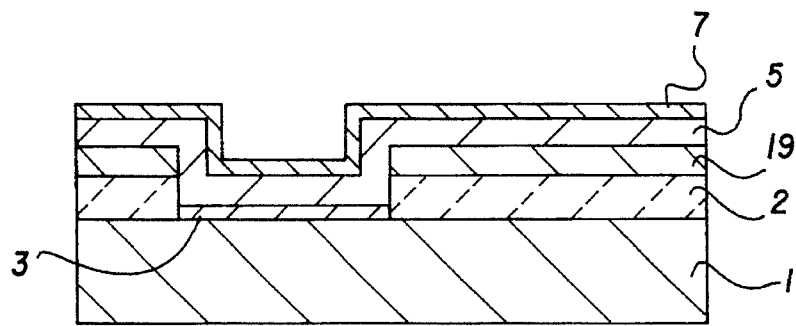

Then, as shown in FIG. 16, the memory nitride film 5 is subjected to the thermal oxidation to thereby form the top oxide film 7.

Figure 17:
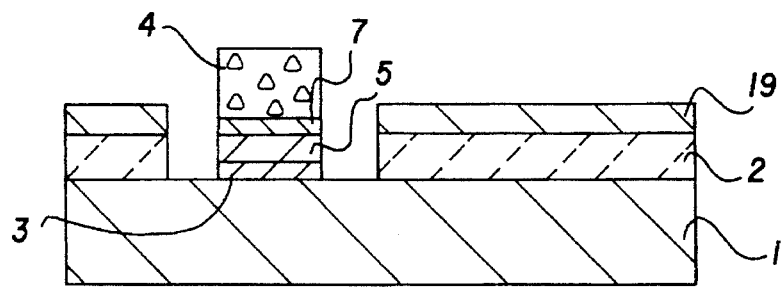

Next, as shown in FIG. 17, the top oxide film 7 and the memory nitride film 5 and the tunnel oxide film 3 are selectively removed using the resist 4.

Figure 18:
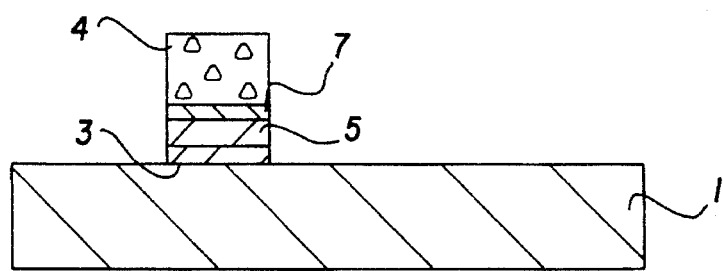

Successively, as shown in FIG. 18, the shielding silicon nitride film 19 and the sacrificial oxide film 2 are removed.

Figure 19:
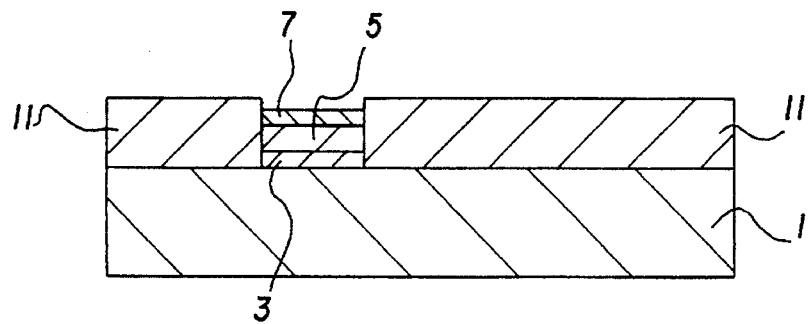

Then, after removing the resist 4, as shown in FIG. 19, the silicon substrate 1 is subjected to the thermal oxidation to thereby form the gate oxide film (insulator film) 11 for the peripheral circuit.

Figure 20:
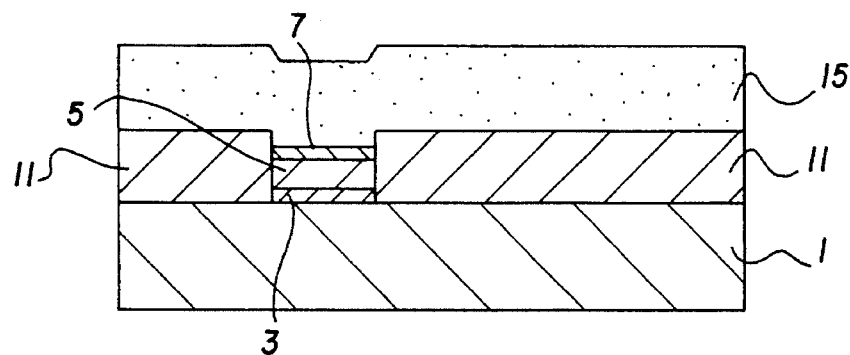

Further, as shown in FIG. 20, the gate electrode film member 15 comprising polycrystalline silicon, etc. is formed on these films using the chemical vapor deposition process.

Figure 21:
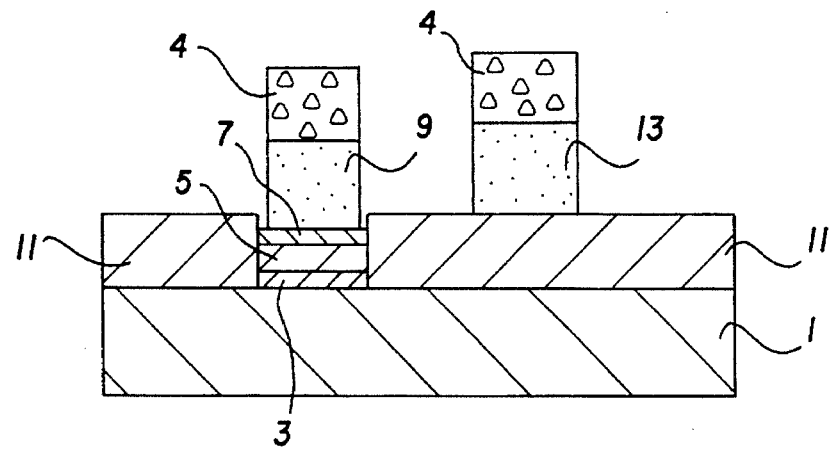

Then, as shown in FIG. 21, the gate electrode film member 15 is selectively removed using the resist 4 to thereby form the memory gate electrode film 9 constituting the nonvolatile memory gate portion and the gate electrode film 13 of the MOS transistor constituting the peripheral circuit gate portion.

Subsequent steps may be taken in the same way as those in the method of fabricating the semiconductor device on which the nonvolatile memory is not mounted.

It is confirmed that the shielding silicon nitride film 19 is sufficient to have the thickness of about 5 nm in the thermal nitriding step as shown in FIG. 14. Accordingly, at the time of forming the shielding silicon nitride film 19 in the step as shown in FIG. 11, the shielding silicon nitride film 19 is preferable to have the thickness of greater than 5 nm considering the reduction of the thickness at the intermediate steps and it is normally sufficient to have the thickness of 10 nm. The thickness of the shielding silicon nitride film 19 is substantially the same as the thickness of the memory nitride film 5 and the shielding silicon nitride film 19 can be formed easily and does not exert a bad influence such as a stress upon the periphery thereof.

The step for removing the shielding silicon nitride film 19 and the sacrificial oxide film 2 as shown in FIG. 18 is performed successively to the step for selectively removing the top oxide film 7 and the resist 4 using the resist 4 as shown in FIG. 17, which results in dispensing with unnecessary additional resist step for removing the shielding silicon nitride film 19.

Accordingly, there are very slight steps to be added to the steps of the conventional method of fabricating the semiconductor device when embodying the method of fabricating the semiconductor device of the present invention.

The reason the shielding silicon nitride film 19 is formed on the sacrificial oxide film 2 in the step as shown in FIG. 11 is that the etch rate between the nitride film and the silicon can not be sufficiently large if the substrate of the shielding silicon nitride film 19 is the silicon substrate 1 at the time of removing the shielding silicon nitride film 19.

According to the method of fabricating the semiconductor of the first embodiment of the second aspect of the invention, the tunnel oxide film 3 can be subjected to the thermal nitriding with mere slight increase of the steps without influencing the transistor characteristics of the peripheral circuit.

The semiconductor nonvolatile storage element (MONOS memory) of the semiconductor device to be fabricated by the method of this embodiment obtains the same effect as the first aspect of the invention since the pattern size of the memory gate electrode film 9 within the storage element region is to be smaller than at least that of the memory nitride film 5.

The aforementioned embodiments employ the MONOS memory as the semiconductor nonvolatile storage memory but the method of fabricating the semiconductor device of the present invention can be applied to the semiconductor on which other semiconductor nonvolatile storage elements are mounted.

Described hereinafter are second and third embodiments of the second aspect of the invention which are applied to the method of fabricating the semiconductor device on which the MNOS memory and the floating gate memory are respectively mounted.

FIGS. 22 to 26 are typical cross-sectional views showing each step in the method of fabricating the semiconductor device in sequence of steps on which the MNOS memory according to the second embodiment of the second aspect of the invention is mounted wherein only the steps which are different from those of the first embodiment of the second aspect of the invention are exemplified.

Steps in the second embodiment ranging from the step to form the sacrificial oxide film 2 on the semiconductor substrate 1 to the step to form the memory nitride film 5 are the same as shown in FIGS. 11 to 15 in the first embodiment.

Figure 22:
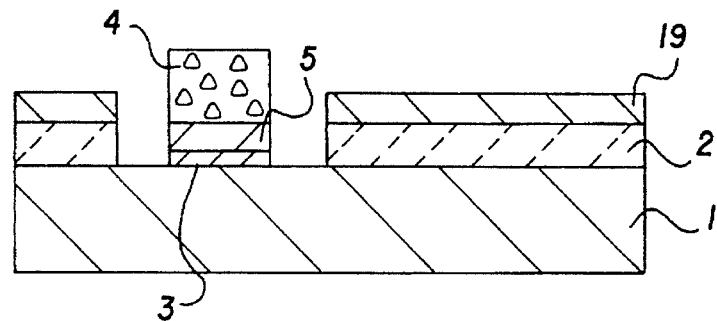
FIGS. 22 to 26 are typical cross-sectional views showing each step in a method of fabricating the semiconductor device in sequence of steps on which a MNOS memory according to the second embodiment of the second aspect of the invention is mounted wherein only the steps which are different from those of the first embodiment of the second aspect of the invention are exemplified.

After the formation of the memory nitride film 5, as shown in FIG. 22, the memory nitride film 5 is selectively removed using the resist 4.

Figure 23:
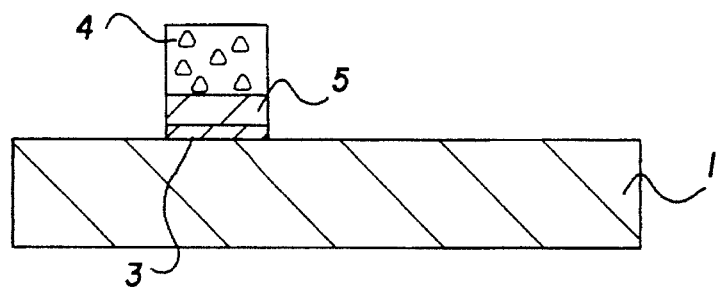

Successively, as shown in FIG. 23, the shielding silicon nitride film 19 and the sacrificial oxide film 2 are removed.

Figure 24:
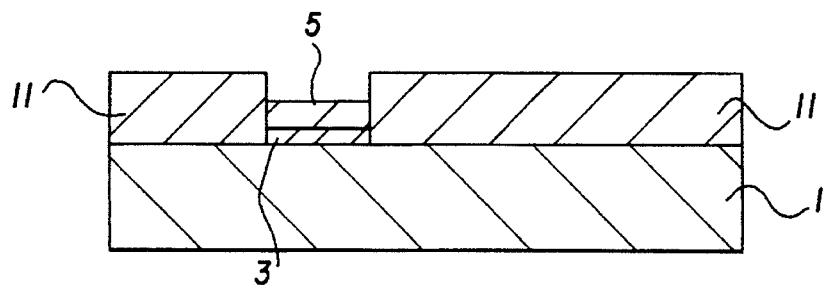

Then, after removing the resist 4, as shown in FIG. 24, the silicon substrate 1 is subjected to the thermal oxidation to thereby form the gate oxide film 11 for the peripheral circuit. Thereafter, the oxide film on the memory nitride film 5 is selectively removed by the thermal oxidation treatment.

Figure 25:
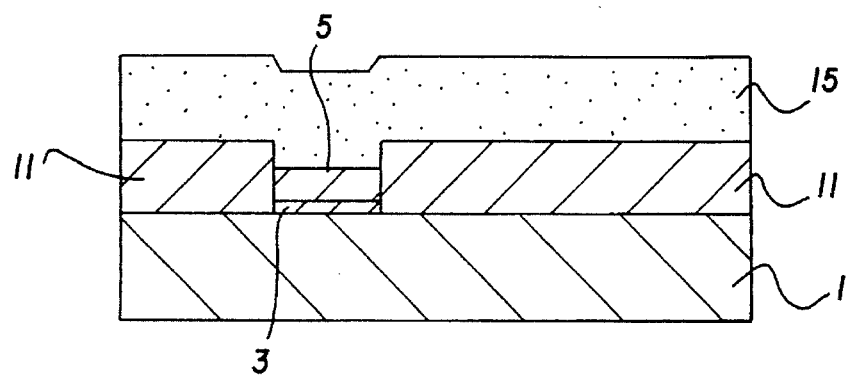

Then, as shown in FIG. 25, the gate electrode film member 15 comprising the polycrystalline silicon, etc., is formed on these films.

Figure 26:
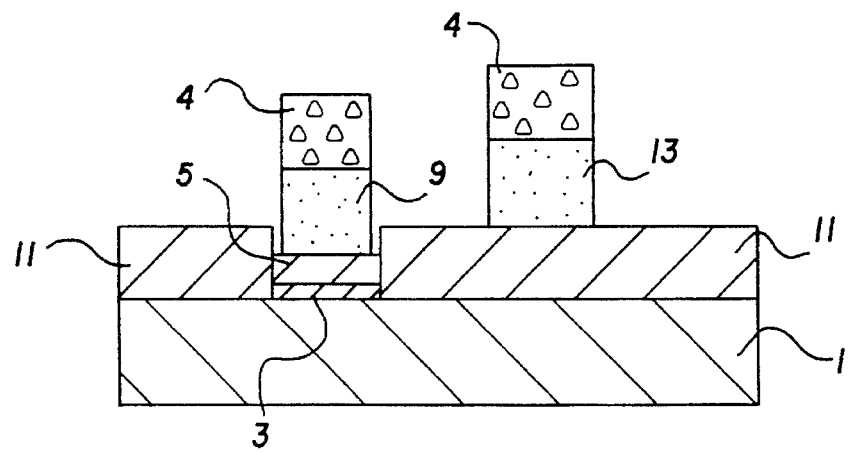

Thereafter, as shown in FIG. 26, the gate electrode film member 15 is selectively removed using the resist 4 to thereby form the memory gate electrode film 9 constituting the nonvolatile memory gate portion and the gate electrode film 13 of the MOS transistor constituting the peripheral circuit gate portion.

Subsequent steps may be taken in the same way as those in the method of fabricating the semiconductor device on which the nonvolatile memory is not mounted.

FIGS. 27 to 33 are typical cross-sectional views showing sequentially each step of the third embodiment of the second aspect of the invention in which the present invention is applied to a method of fabricating the semiconductor device on which the floating gate memory is mounted as the semiconductor nonvolatile storage element. Also, in the third embodiment, the illustration of the same steps which are the same as those of the first embodiment is omitted.

Also in the third embodiment, steps ranging from the step to form the sacrifice film 2 on the semiconductor substrate 1 to the step to subject the tunnel oxide film 3 to the thermal nitriding in the atmosphere including the ammonia gas 16 are the same as those as shown in FIGS. 11 to 14 of the first embodiment.

Figure 27:
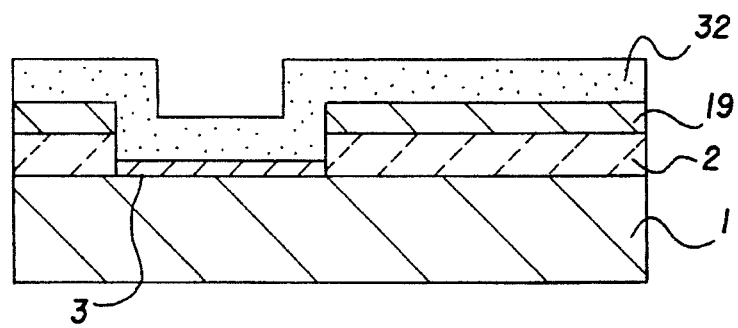
FIGS. 27 to 33 are typical cross-sectional views showing each step in a method of fabricating the semiconductor device in sequence of steps on which a floating gate memory according to the third embodiment of the second aspect of the invention is mounted wherein only the steps which are different from those of the first and second embodiments of the second aspect of the invention are exemplified.

After the tunnel oxide film 3 is subjected to the thermal nitriding, a charge trapping polycrystalline silicon film 32 is formed by the chemical vapor deposition process as shown in FIG. 27.

Figure 28:
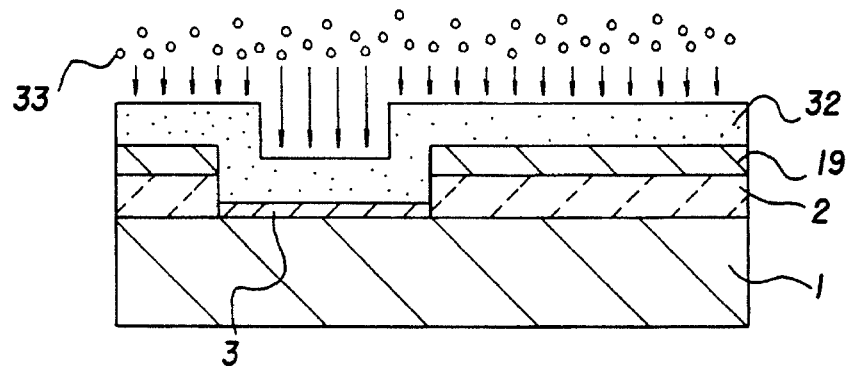

Thereafter, as shown in FIG. 28 impurities 33 are implanted into the charge trapping polycrystalline silicon film 32 using ion implantation method or thermal diffusion method.

Figure 29:
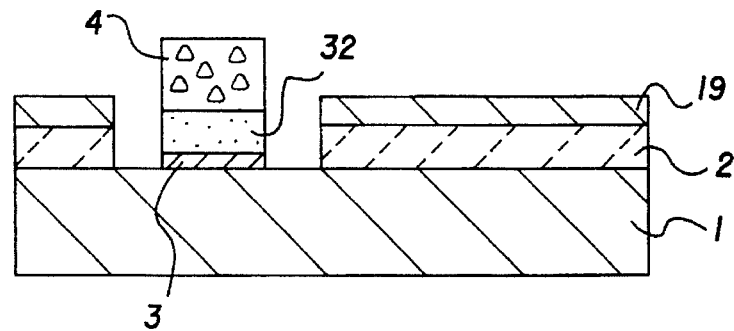

Then, the charge trap polycrystalline silicon film 32 is selectively removed using the resist 4 as shown in FIG. 29.

Figure 30:
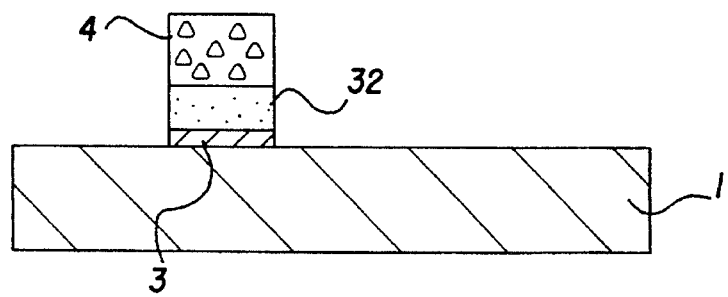

Successively, the silicon nitride film 19 and the sacrificial oxide film 2 are removed as shown in FIG. 30.

Figure 31:
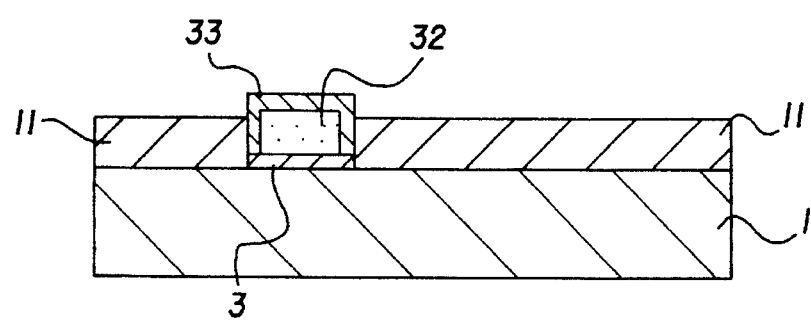

Thereafter, after removing the resist 4, as shown in FIG. 31, the semiconductor substrate 1 is subjected to the thermal oxidation to thereby form the gate insulator film member 11 for the peripheral circuit and also form an oxide film 33 on the surface of the charge trap polycrystalline silicon film 32.

Figure 32:
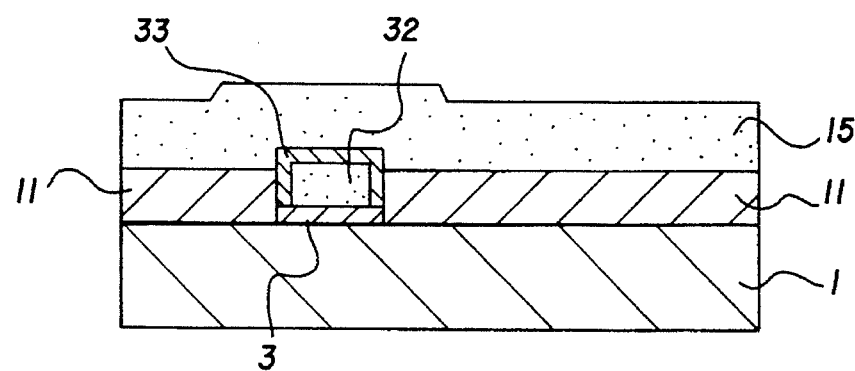

Then, as shown in FIG. 32, the gate electrode film member 15 formed of polycrystalline silicon is formed on these films.

Figure 33:
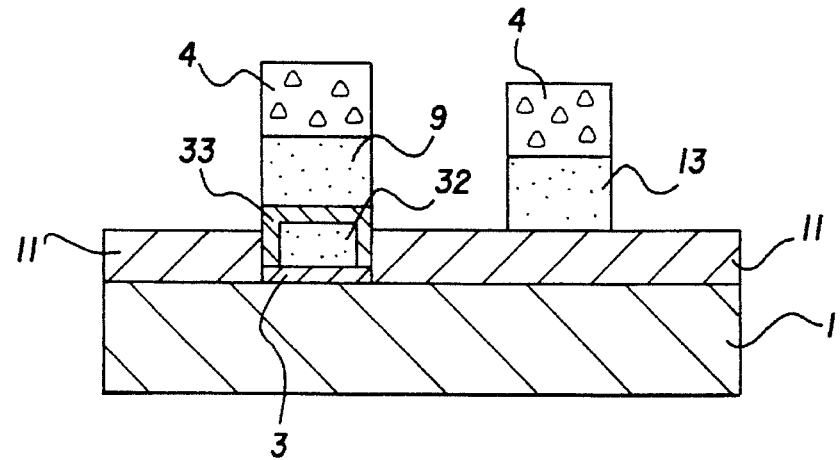
Figure 34:
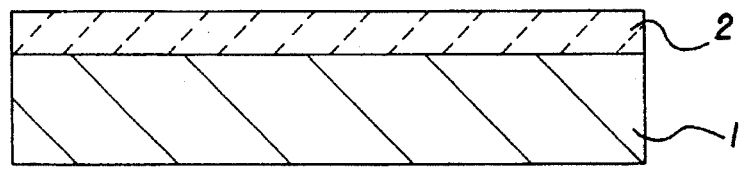
FIGS. 34 to 43 are typical cross-sectional views showing each step in a method of fabricating the semiconductor device in sequence of steps on which the prior art MONOS memory is mounted.
Figure 35:
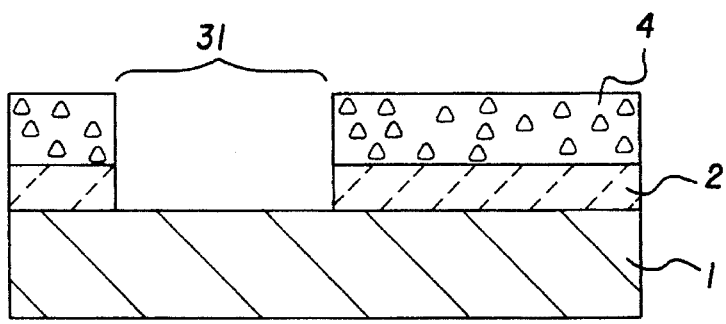
Figure 36:
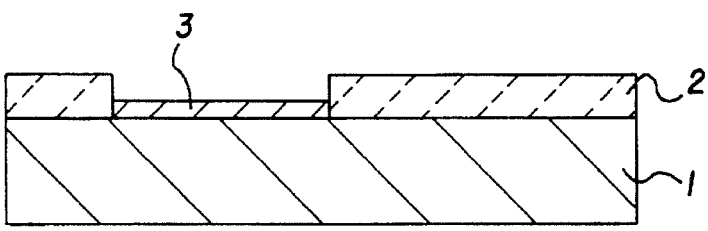
Figure 37:
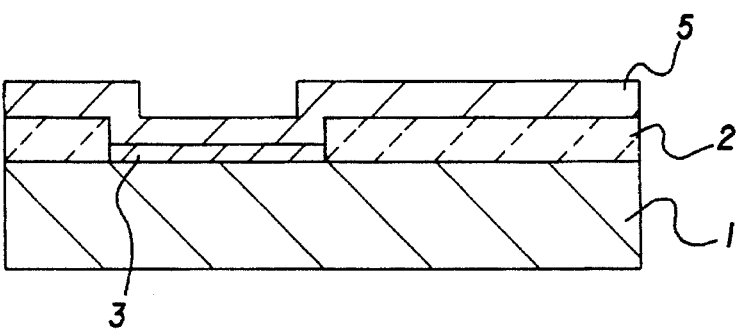
Figure 38:
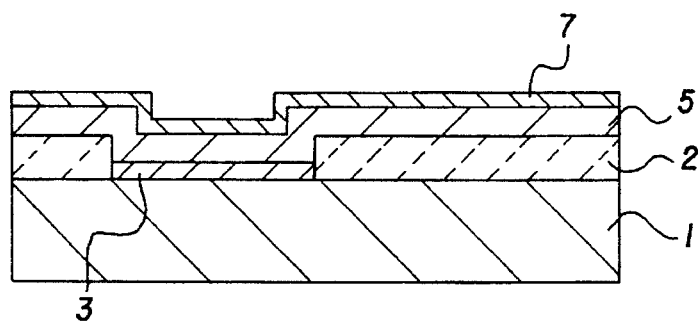
Figure 39:
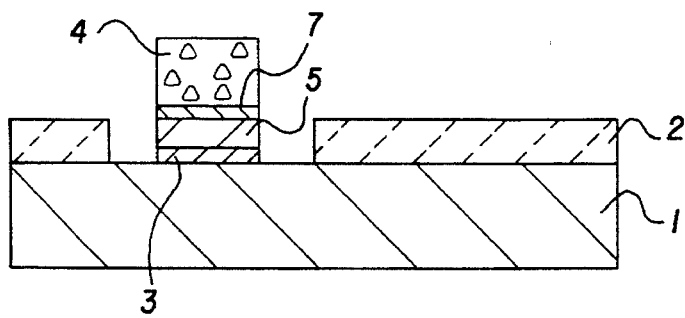
Figure 40:
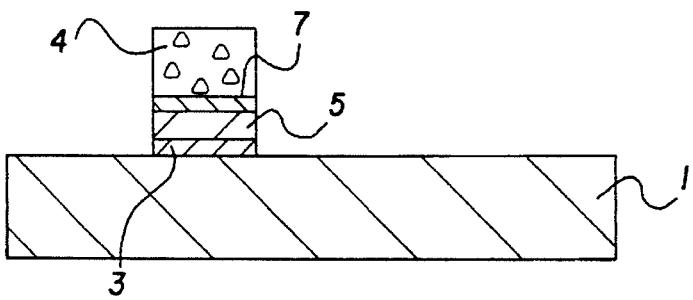
Figure 41:
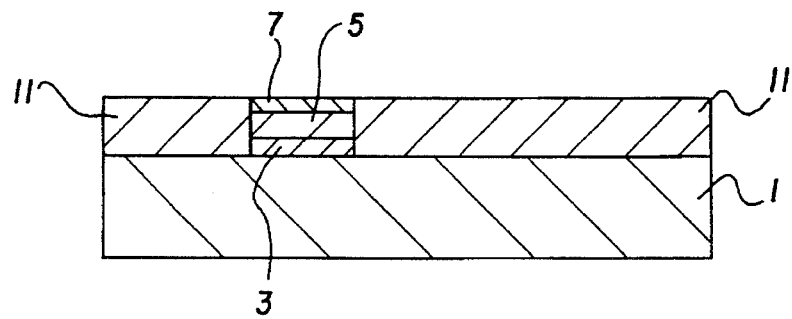
Figure 42:
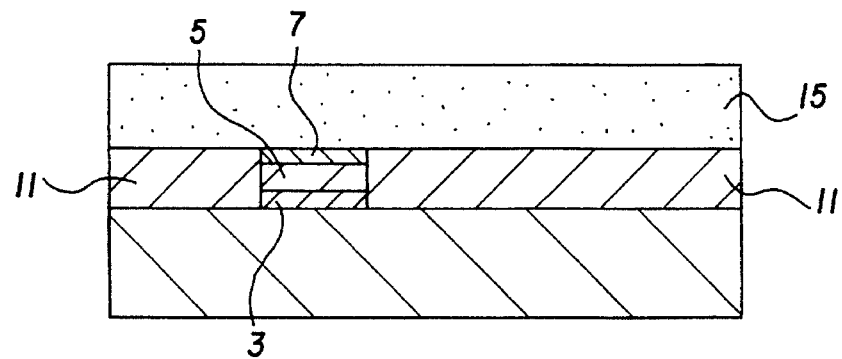
Figure 43:
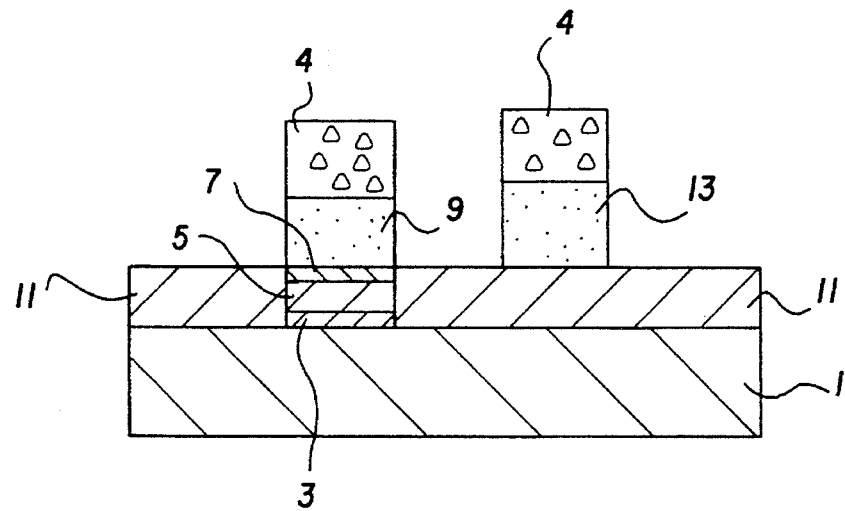
Figure 44:
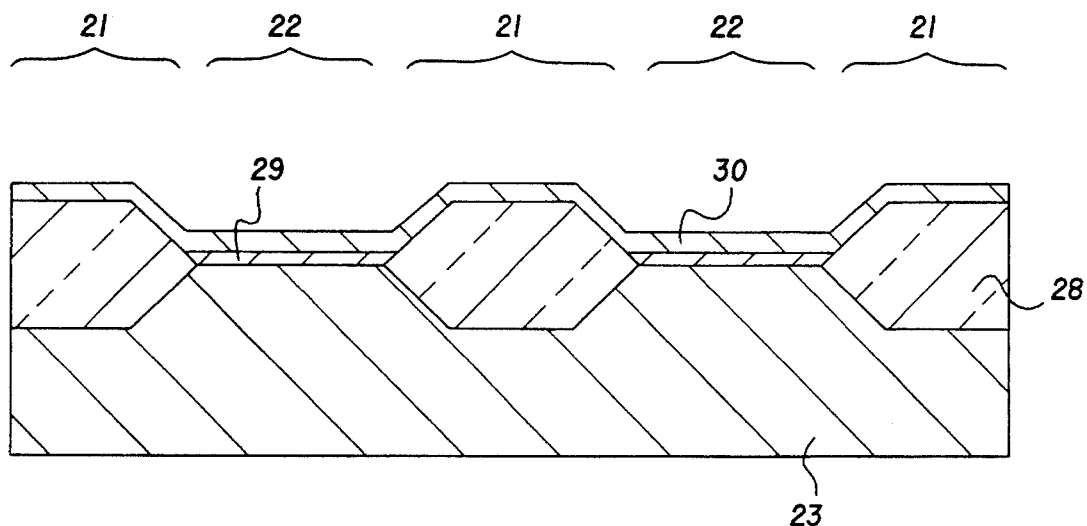
FIGS. 44 and 45 are typical cross-sectional views showing a structure for and a method of fabricating a prior art semiconductor nonvolatile storage element.
Figure 45:
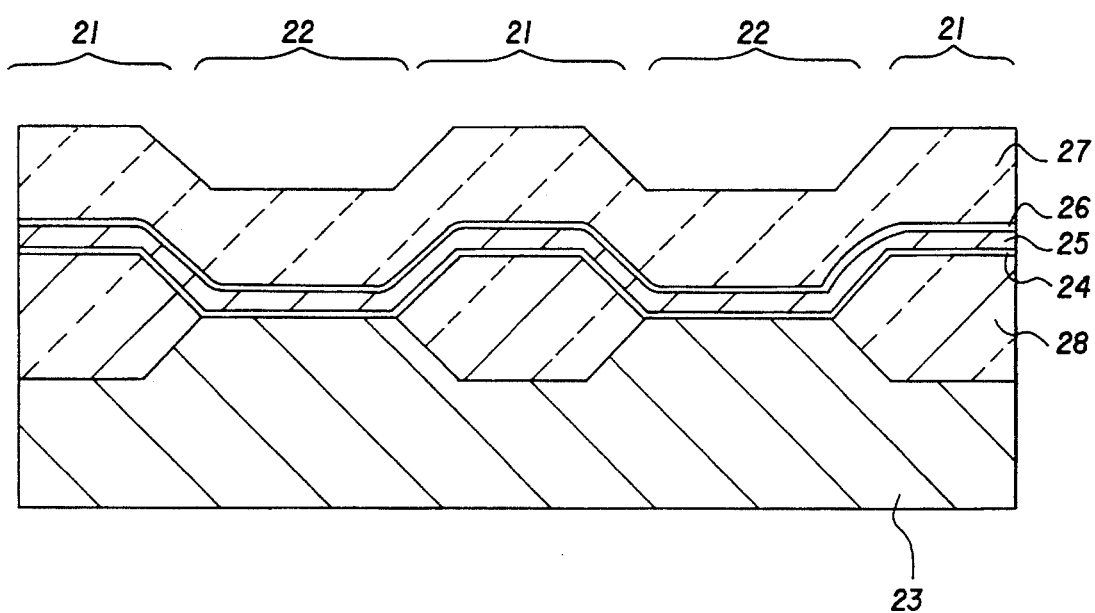

Further, as shown in FIG. 33, the gate electrode film 13 is selectively removed using the resist 4 to thereby form the memory gate electrode film 9 constituting the nonvolatile memory gate portion and the gate electrode film 13 of the MOS transistor constituting the peripheral circuit gate portion.

Subsequent steps may be taken in the same way as those in the method of fabricating the semiconductor device on which the nonvolatile memory is not mounted.

In any of the first to third embodiments of the second aspect of the invention, the shielding silicon nitride film is selectively removed after the peripheral circuit portion is covered by the shielding silicon nitride film and the charge trapping film is selectively removed before the tunnel oxide film is subjected to the thermal nitriding so that the tunnel oxide film can be subjected to the thermal nitriding without influencing the transistor characteristics of the peripheral circuit irrespective of the kinds of the semiconductor nonvolatile memory.

In such a manner, it is possible to mount the semiconductor nonvolatile memory having the high erasing speed on the semiconductor device even if the latter includes an analog circuit, effect of which is very conspicuous.

[Third Aspect of the Invention]

The embodiment of the third aspect of the invention will be described with reference to FIGS. 46 to 48.

First, the structure of the semiconductor nonvolatile storage element according the third aspect of the invention will be described with reference to FIG. 48. FIG. 48 is a typical cross-sectional view of the memory transistor taken along the channel width direction.

In the semiconductor nonvolatile storage element, a memory transistor for constituting this semiconductor nonvolatile storage element comprises the element forming regions 22 within which the tunnel oxide film 24, the silicon nitride film 25, the top oxide film 26 and the memory gate electrode 27 which are sequentially layered on the semiconductor substrate 23 and the field regions 21 within which the field oxide film 28 and the memory gate electrode 27 are formed.

That is, the tunnel oxide film 24, the silicon nitride film 25 and the top oxide film 26 are formed within the storage element regions 22 alone.

Described hereinafter is a method of fabricating the semiconductor nonvolatile storage element according to the embodiment of the third aspect of the invention.

Figure 46:
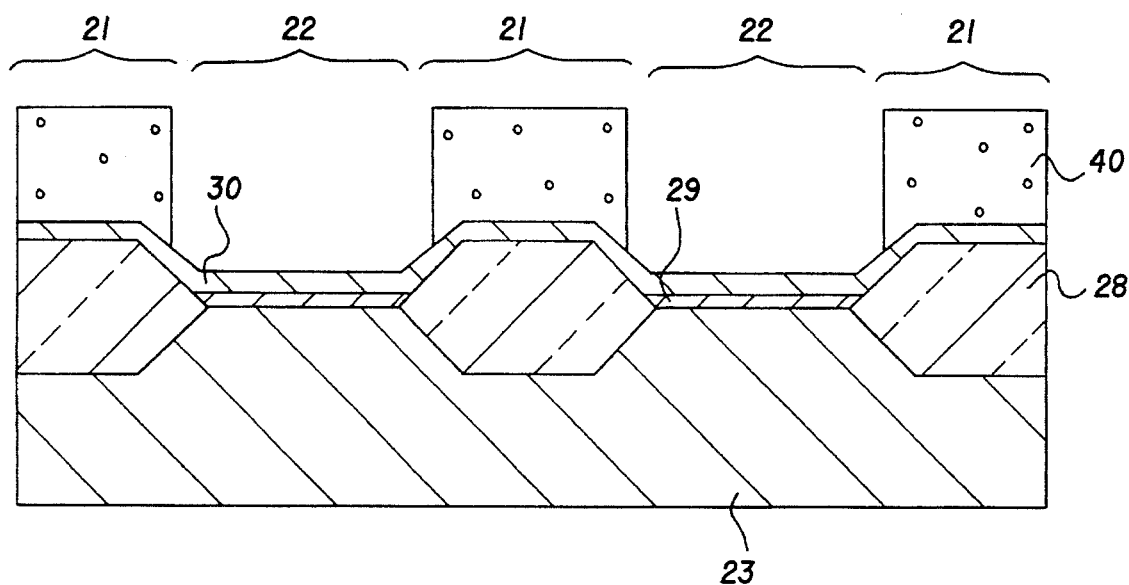
FIGS. 46 to 48 are typical cross-sectional views showing a structure for and a method of fabricating a semiconductor nonvolatile storage element according to a third aspect of the invention.
Figure 47:
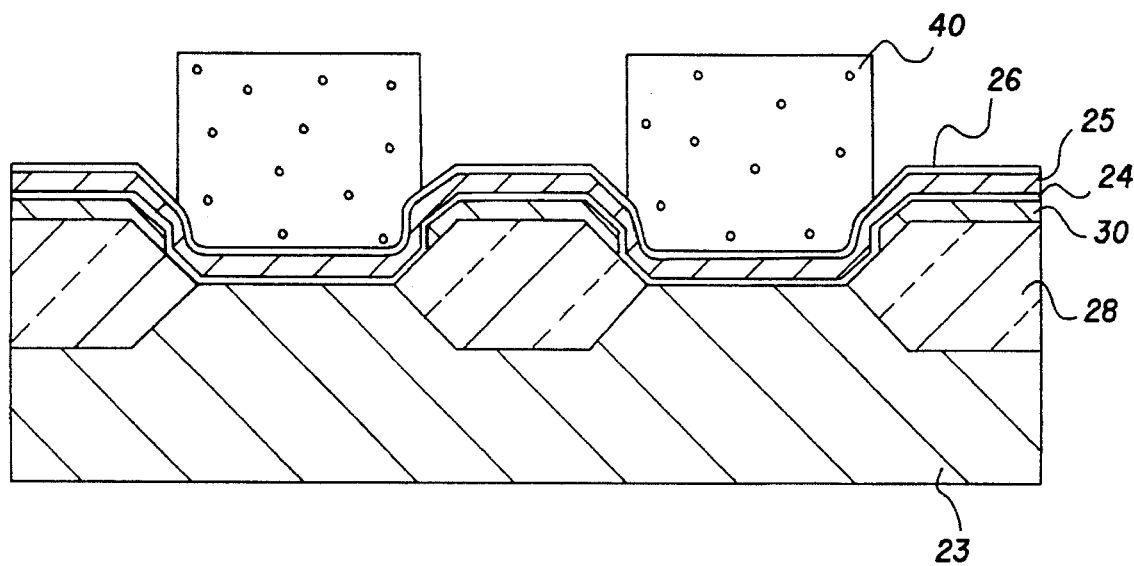
Figure 48:
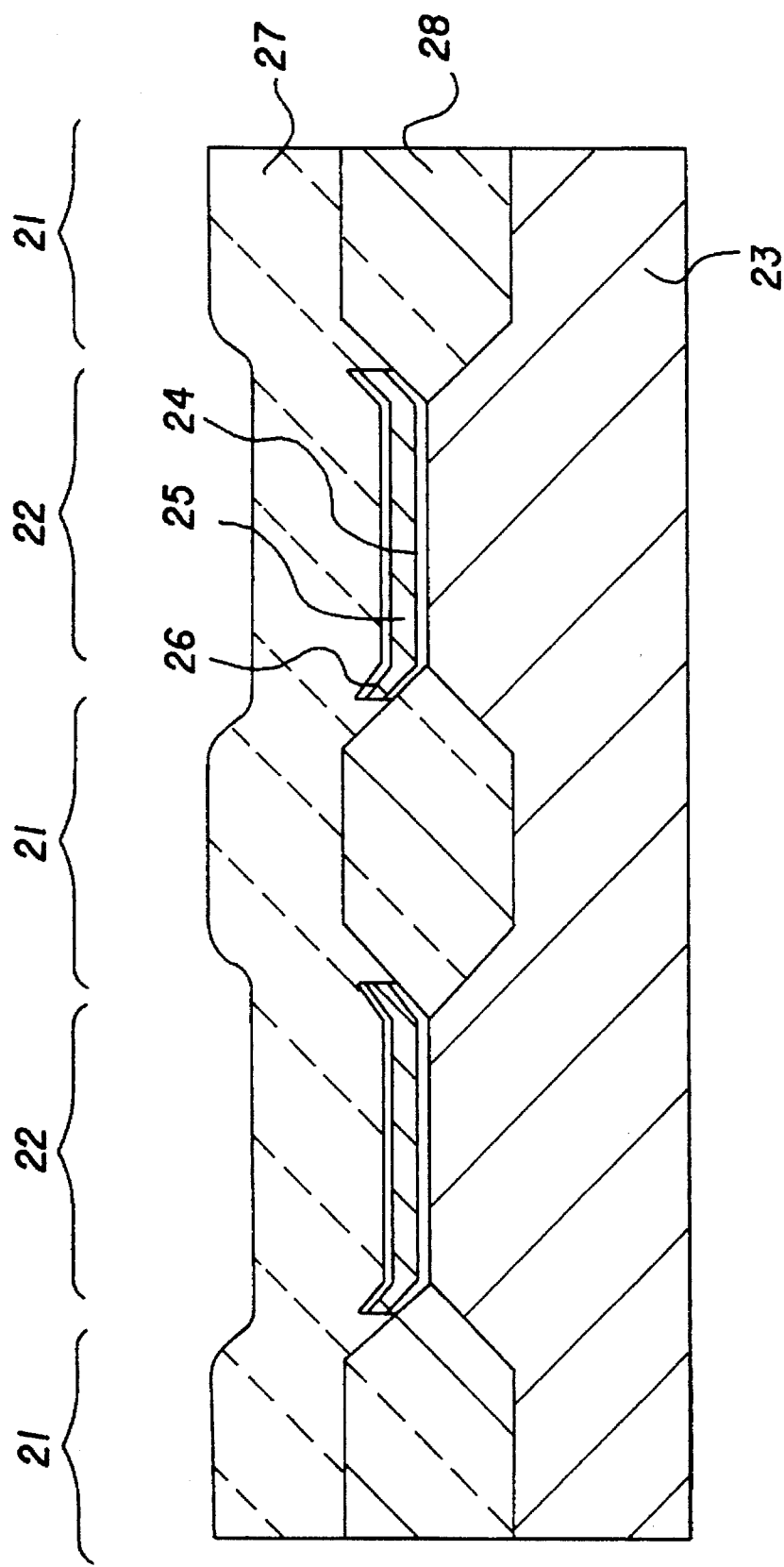

FIGS. 46 to 48 are typical cross-sectional views which are taken along the channel width direction of the memory transistor and show each step in sequence of steps in the method of fabricating the semiconductor nonvolatile storage element.

First, as shown in FIG. 46, the first conductor type, i.e. P-type semiconductor substrate 23 is subjected to an oxidation treatment within the storage element regions 22 using an oxide resistant film such as a silicon nitride film as a mask, namely, subjected to the selective oxidation so that the field oxide film 28 is formed within the field regions 21 with the thickness of 700 nm.

Then, the oxidation treatment is performed in the mixed gas of oxygen and nitrogen to from a sacrificial oxide film 29 composed of silicon dioxide having the thickness of about 50 nm on the entire surface of the semiconductor substrate 23 so as to stabilize the surface of the semiconductor substrate 23 within the storage element regions 22.

Then, the shielding silicon nitride film 30 having the thickness of 10 nm is formed by the chemical vapor deposition process using dichlorosilane ($SiH_2Cl_2$) and ammonia ($NH_3$) as a reaction gas.

The shielding silicon nitride film 30 is provided for preventing the ammonia which is generated at the thermal nitriding treatment in the atmosphere including ammonia and hydrogen which is produced by the decomposition of ammonia respectively in the later step from being diffused into the field oxide film 28.

Then, the photosensitive resin forming the photosensitive material is applied to the entire surface of the shielding nitride film 30 by a spin coating method and the photosensitive resin is subjected to the exposure and development treatment, thereby forming openings in the photosensitive resin within the storage element regions 22.

Thereafter, the shielding silicon nitride film 30 is removed from the storage element regions 22 using the mixed gas of the sulfur hexafluoride ($SF_6$), Helium (He) and methane trifluoride ($CHF_3$) as an etching gas using a reactive ion-assist etcher with the photosensitive resin as a mask. Further, the sacrificial oxide film 29 is etched using a hydrofluoric acid buffer solution to thereby remove the sacrificial oxide film 29 within the storage element regions 22. Thereafter, the photosensitive resin which was used as the etching mask is removed.

Then, as shown in FIG. 47, the oxidation treatment is performed in the mixed gas of oxygen and nitrogen to thereby form the tunnel oxide film 24 composed of the silicon dioxide film and having the thickness of about 2 nm. If the tunnel oxide film 24 is processed for example in the ammonia atmosphere at the temperature of 1000° C. for 30 minutes so that the tunnel oxide film 24 is changed to the nitride oxide film. When the tunnel oxide film 24 is changed to the nitride oxide film, the data writing speed in the semiconductor nonvolatile storage element can be speeded up.

Then, the silicon nitride film 25 having the thickness of about 11 nm is formed on the entire surface including the tunnel oxide film 24 using the chemical vapor deposition process.

Thereafter, the oxidation treatment is performed to thereby form the top oxide film 26 composed of the silicon oxide film having the thickness of about 5 nm on the silicon nitride film 25.

When the top oxide film 26 is formed on the silicon nitride film 25, the thickness of the silicon nitride film 25 is reduced from 11 nm in the first place to about 8 nm.

Then, a photosensitive resin 40 is formed on the entire surface of the top oxide film 26 and the photosensitive resin 40 is subjected to the exposure and development treatment using a given photomask to thereby form the photosensitive resin 40 within the storage element regions 22.

Thereafter, the top oxide film 26 is etched by the hydrofluoric acid buffer solution using the photosensitive resin 40 as an etching mask and then the silicon nitride film 25, the tunnel oxide film 24 and the shielding silicon nitride film 30 are etched by a dry etching using the mixed gas of hexafluoride, helium and methane trifluoride as the etching gas. Thereafter, the photosensitive resin 40 is removed.

Then, as shown in FIG. 48, a memory gate electrode member composed of a polycrystalline silicon film and having the thickness of 400 nm is formed on the entire surface by the chemical vapor deposition process using monosilane ($SiH_4$) as a reaction gas.

Thereafter, the photosensitive resin, not shown, is formed on the entire surface using the spin coating method and the photosensitive resin was subjected to the exposure and development treatment using a given photomask and the photosensitive resin is subjected to a patterning so as to form the memory gate 27.

Then, the memory gate 27 is formed using the photosensitive resin as the etching mask. The memory gate 27 is etched by the reactive ion-assist etcher using the mixed gas of the hexafluoride ($SF_6$) and oxygen ($O_2$) as the etching gas.

Thereafter, the photosensitive resin which was subjected to the patterning and used as the etching mask for forming the memory gate electrode 27 is removed.

In such a manner, there is obtained the structure of the transistor constituting the semiconductor nonvolatile storage element which comprises memory element forming regions 22 composed of the tunnel oxide film 24, the silicon nitride film 25, the top oxide film 26 and the memory gate electrode 27 and the field regions 21 composed of the field oxide film 28 and the memory gate electrode 27.

Although the illustration of the subsequent steps is omitted, there are formed a source region and a drain region of high density impurity layers on the semiconductor substrate 23 within the region where the memory gate electrode 27 is aligned by implanting arsenic which is an impurity of conductor reverse to the semiconductor substrate 23.

Arsenic ion dose to be implanted into the semiconductor substrate 23 to form the source region and the drain region is about $3 \times 10^{15}$ cm$^{-2}$.

Thereafter, an interlayer insulator film composed of a silicon oxide film including phosphor and boron is formed by the chemical vapor deposition process and then a contact hole is formed in the interlayer insulator film using the photosensitive resin as the etching mask. Successively, a metallization member made of aluminum including silicon and copper is formed by spattering method and the metallization member is subjected to patterning to thereby form the interconnections of the metallization, whereby the semiconductor nonvolatile storage element can be obtained.

According to the structure and the method of fabricating the semiconductor nonvolatile storage element, the silicon nitride film is present on the field oxide film within the field regions in the step for forming the tunnel oxide film and the step for subjecting the tunnel oxide film to the thermal nitriding in the atmosphere including ammonia. Accordingly, the silicon nitride film prevents ammonia as the reaction gas and hydrogen which is produced by the decomposition of ammonia respectively from being diffused into the field oxide film.

Accordingly, dissociation of the oxide film by hydrogen is suppressed so that the positive charges on the insulator film do not increase.

As a result, the threshold voltage of the parasitic MOS transistor formed by the field oxide film is not deteriorated and the current is not leaked between memory cells, thereby obtain the semiconductor nonvolatile storage element having high reliability.

INDUSTRIAL UTILIZATION

As mentioned above, the semiconductor nonvolatile storage element according to the invention operates with assurance and high reliability and data is rewriteable so many times. Furthermore, according to the method of fabricating the semiconductor device, the semiconductor nonvolatile memory having the high erasing speed can be mounted on the semiconductor device even if the semiconductor device includes the analog circuit.

Accordingly, the performance of the semiconductor nonvolatile storage element which are used for storing various data in various information processors, electronic devices, industrial machine and implements, etc. and the performance of the semiconductor device on which the semiconductor nonvolatile storage element is mounted can be respectively remarkably improved and therefore the performance of the machinery and implement using thereof can be also improved.

We claim:

1. A method of fabricating a semiconductor device comprising the steps of:

forming a sacrificial oxide film on a silicon substrate;

forming a shielding silicon nitride film over said silicon substrate on which said sacrificial oxide film is formed;

selectively removing said shielding silicon nitride film and said sacrificial oxide film at storage element forming regions to thereby expose the surface of said silicon substrate within each of said storage element forming regions;

forming a tunnel oxide film on the exposed surface of said silicon substrate;

subjecting said tunnel oxide film to a thermal nitriding in an atmosphere including ammonia gas;

forming a charge trapping silicon nitride film or a charge trapping polycrystalline silicon film on said tunnel oxide film which was subjected to the thermal nitriding; and removing said shielding silicon nitride film at any step after the formation of the charge trapping film.

2. A method of fabricating a semiconductor device comprising the steps of:

forming a sacrificial oxide film on a silicon substrate;

forming a shielding silicon nitride film over said silicon substrate on which said sacrificial oxide film is formed;

selectively removing said shielding silicon nitride film and said sacrificial oxide film at storage element forming regions to thereby expose the surface of said silicon substrate within each of said storage element forming regions;

subjecting the exposed surface of said silicon substrate to a thermal oxidation to thereby form a tunnel oxide film;

subjecting said tunnel oxide film to a thermal nitriding in an atmosphere including ammonia gas;

forming a memory nitride film on said tunnel oxide film which was subjected to the thermal nitriding;

subjecting said memory nitride film to a thermal oxidation to thereby form a top oxide film;

selectively removing said top oxide film and said memory nitride film so that they remain at least on said tunnel oxide film;

successively to the previous step, removing said shielding silicon nitride film and said sacrificial oxide film to thereby expose the surface of said silicon substrate;

subjecting the exposed surface of said silicon substrate to a thermal oxidation to thereby form a gate insulator film;

forming a gate electrode film member over said silicon substrate on which said gate insulator film is formed; and selectively removing said gate electrode film member to thereby form a nonvolatile storage element gate portion and a peripheral circuit gate portion.

3. A method of fabricating a semiconductor device comprising the steps of:

forming a sacrificial oxide film on a silicon substrate;

forming a shielding silicon nitride film over said silicon substrate on which said sacrificial oxide film is formed;

selectively removing said shielding silicon nitride film and said sacrificial oxide film at storage element forming regions to thereby expose the surface of said silicon substrate within each of said storage element forming regions;

subjecting the exposed surface of said silicon substrate to a thermal oxidation to thereby form a tunnel oxide film;

subjecting said tunnel oxide film to a thermal nitriding in an atmosphere including ammonia gas;

forming a memory nitride film over said tunnel oxide which was subjected to the thermal nitriding and forming an oxide film on the surface of the memory nitride film;

selectively removing said memory nitride film so that it remains at least on said tunnel oxide film;

successively to the previous step, removing said shielding silicon nitride film and said sacrificial oxide film to thereby expose the surface of said silicon substrate;

subjecting the exposed surface of said silicon substrate to a thermal oxidation to thereby form a gate insulator film;

selectively removing the oxide film on the surface of said memory nitride film;

forming a gate electrode film member on said silicon substrate on which said gate insulator film is formed; and selectively removing said gate electrode film member to thereby form a nonvolatile storage element gate portion and a peripheral circuit gate portion.

4. A method of fabricating a semiconductor device comprising the steps of:

forming a sacrificial oxide film on a silicon substrate;

forming a shielding silicon nitride film over said silicon substrate on which said sacrificial oxide film is formed;

selectively removing said shielding silicon nitride film and said sacrificial oxide film at storage element forming regions to thereby expose the surface of said silicon substrate within each of said storage element forming regions;

subjecting the exposed surface of said silicon substrate to a thermal oxidation to thereby form a tunnel oxide film;

subjecting said tunnel oxide film to a thermal nitriding in an atmosphere including ammonia gas;

forming a charge trapping polycrystalline silicon film over said silicon substrate which was subjected to the thermal nitriding; and implanting impurities into said charge trapping polycrystalline silicon film;

selectively removing said charge trapping polycrystalline silicon film so that it remains at least on said tunnel oxide film;

successively to the step of selectively removing said charge trapping polycrystalline silicon film, removing said shielding silicon nitride film and said sacrificial oxide film to thereby expose the surface of said silicon substrate;

subjecting the exposed surface of said silicon substrate to a thermal oxidation to thereby form a gate insulator film;

forming a gate electrode film member over said silicon substrate on which said gate insulator film is formed; and selectively removing said gate electrode film member to thereby form a nonvolatile storage element gate portion and a peripheral circuit gate portion.

* * * * *

UNITED STATES PATENT AND TRADEMARK OFFICE
CERTIFICATE OF CORRECTION

PATENT NO.: 5,496,753
DATED : March 5, 1996
INVENTOR(S): Yasuhiro SAKURAI, Toshiyuki KISHI It is certified that error appears in the above-identified patent and that said Letters Patent is hereby corrected as shown below:

On the cover page, Item [86], "PCT/JP93/00772" should read -- PCT/JP93/00722--.

Signed and Sealed this

Twenty-fourth Day of September, 1996

Attest:

BRUCE LEHMAN

*Attesting Officer*  *Commissioner of Patents and Trademarks*